(12) United States Patent
Tsubota et al.

(10) Patent No.: US 7,424,386 B2
(45) Date of Patent: Sep. 9, 2008

(54) SWITCH MECHANISM AND ELECTRONIC APPARATUS

(75) Inventors: Tetsuro Tsubota, Shizuoka (JP); Atsushi Kouda, Kanagawa (JP)

(73) Assignee: Sony Corporation, Tokyo (JP)

( * ) Notice: Subject to any disclaimer, the term of this patent is extended or adjusted under 35 U.S.C. 154(b) by 195 days.

(21) Appl. No.: 11/434,360

(22) Filed: May 12, 2006

(65) Prior Publication Data

US 2006/0254895 A1    Nov. 16, 2006

(30) Foreign Application Priority Data

May 16, 2005    (JP)    ............... 2005-142607

(51) Int. Cl.
*G01C 19/00*    (2006.01)
*G06F 15/00*    (2006.01)

(52) U.S. Cl. .................................................. 702/150

(58) Field of Classification Search ................ 702/150; 200/5 E, 314
See application file for complete search history.

(56) References Cited

U.S. PATENT DOCUMENTS

| | | | | | |
|---|---|---|---|---|---|
| 5,698,301 | A | * | 12/1997 | Yonetani | ...................... 428/213 |
| 7,009,117 | B2 | * | 3/2006 | Torii | ........................... 174/262 |
| 2003/0216767 | A1 | * | 11/2003 | List et al. | ..................... 606/181 |
| 2005/0175388 | A1 | * | 8/2005 | Namekawa et al. | ......... 400/625 |

FOREIGN PATENT DOCUMENTS

JP    2005-085506    *  3/2005

* cited by examiner

*Primary Examiner*—Michael P Nghiem
(74) *Attorney, Agent, or Firm*—Frommer Lawrence & Haug LLP; William S. Frommer; Ellen Marcie Emas (57) ABSTRACT

A switch mechanism of a detection sensor unmounted type has a configuration in which an attaching surface for a case body for containing a movable member moved in conjunction with a button operation and a mounting surface for a detection sensor operative to electrically detect a change in the position of the movable member attendant on the button operation are different, and a magnifying mechanism operative to magnifyingly transmit the change in the position of the movable member attendant on the button operation is mounted in the switch mechanism.

8 Claims, 11 Drawing Sheets

SWITCH MECHANISM AND ELECTRONIC APPARATUS

CROSS REFERENCES TO RELATED APPLICATIONS

The present invention contains subject matter related to Japanese Patent Application JP 2005-142607 filed with the Japanese Patent Office on May 16, 2005, the entire contents of which being incorporated herein by reference.

BACKGROUND OF THE INVENTION

The present invention, in its one embodiment, relates to a switch mechanism of a type in which a detection sensor containing a movable member moved in conjunction with a button operation is not mounted. In another embodiment, the present invention relates to an electronic apparatus wherein the switch mechanism of the type in which the detection sensor is not mounted is attached to an operating surface.

In contents production sites and output sites, a large number of material data and program data are dealt with daily. For example, in a contents production site, a multiplicity of material data are dealt with in an editing work. Also, in a contents output site, in addition to produced program data, a large number of live data are switchedly outputted.

In carrying out such works, generally, a control panel having an arrangement of a large number of switches is used. The number of the switches arranged may, in some cases, mount up to several hundreds.

Therefore, each of these switches incorporates a mechanism for enabling easy confirmation of the operation state (ON/OFF) of the switch. For example, a switch incorporates a mechanism for turning ON a button surface when the switch is in the ON state.

Figure 1A:
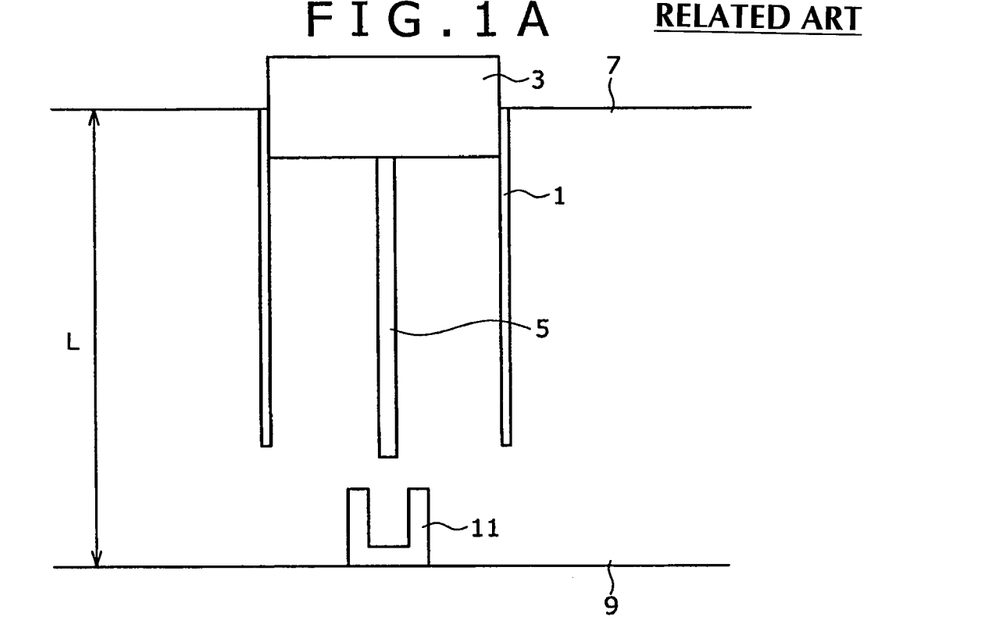
FIGS. 1A and 1B are diagrams illustrating the relationship between a shaft and a photosensor in the case where no mounting error is present (an example of the related art)
Figure 1B:
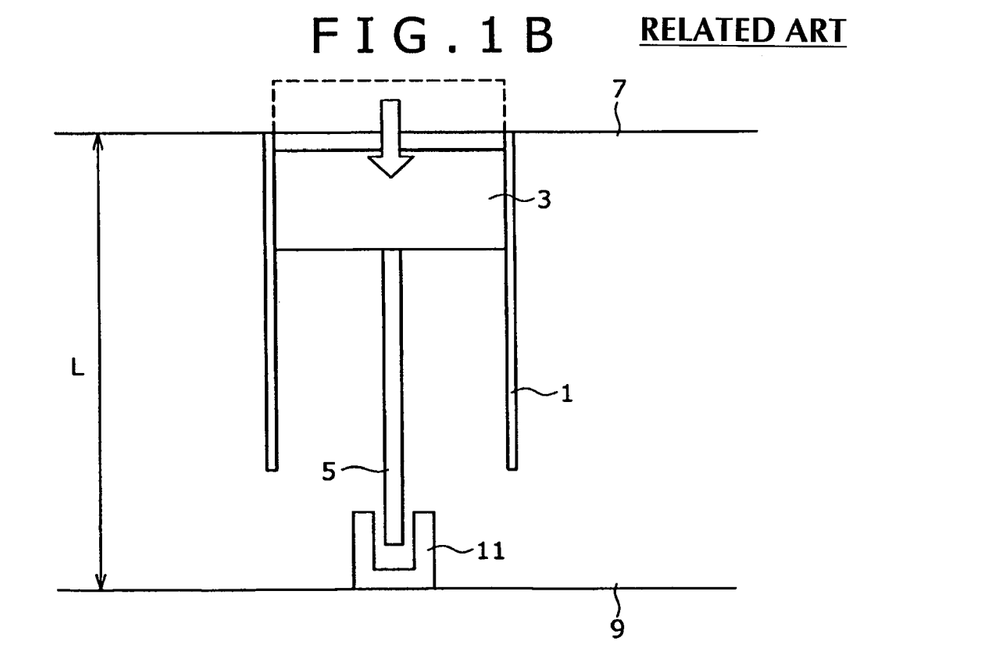

FIG. 1 illustrates a conceptual configuration of a switch. FIG. 1 shows a structure example of a switch based on a system in which a drive mechanism and an electric part are separate from each other.

In the case of this example, the drive mechanism is composed of a button top 3 and a shaft 5 which are housed in a main body case 1. Incidentally, the drive mechanism is attached to an operating surface 7 through the main body case 1.

On the other hand, the electric part is composed of a photosensor 11 mounted on a wiring board 9.

In the switch with this configuration, as the button top 3 is depressed, the tip end of the shaft 5 attached to a bottom portion of the button top 3 is lowered to such a position as to intercept the optical path of the photosensor 11. This condition is detected, whereby the operation of the pushbutton is detected. The condition where the shaft 5 has been pushed down is shown in FIG. 1B.

Incidentally, the main body case is provided on the inside thereof with a step for providing a lowermost point of the depressed position, so that when the button top 3 is depressed to the lowermost point, the bottom surface of the button top 3 abuts on the step and is thereby stopped.

Besides, when a finger having depressed the button top 3 is put off, the button top 3 is returned to its original position by a repelling force of a compression coil spring (not shown). In this instance, the photosensor 11 is again set into a light-detecting condition, to detect that the pushbutton operation is removed. The condition where the shaft 5 has been returned into its original position is shown in FIG. 1A.

(See, for example, Japanese Patent Laid-open No. 2005-85506)

SUMMARY OF THE INVENTION

Meanwhile, the drive mechanism and the detection sensor are connected through many component parts. Therefore, there is a tendency toward accumulation dimensional dispersions of the component parts, assembly errors of the component parts, mounting errors of the detection sensor, etc.

In particular, where deviations in the vertical direction (the direction in which the drive mechanism and the detection sensor on the wiring board are away from each other) are present, there is the possibility that the tip end of the shaft 5 may not reach the position of the detection sensor even when the button top is depressed.

Figure 2A:
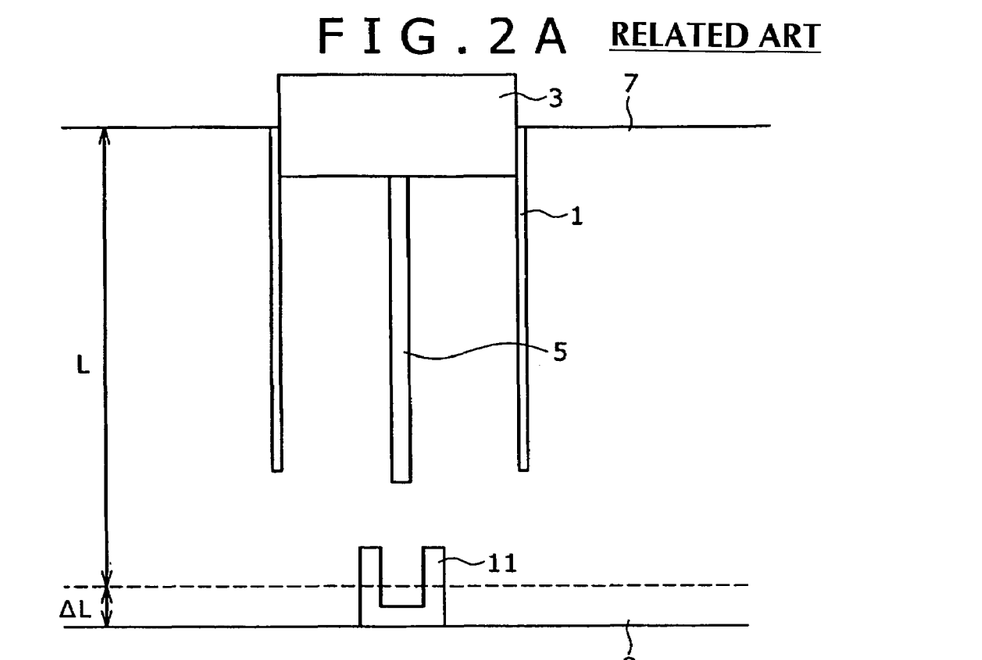
FIGS. 2A and 2B are diagrams illustrating the relationship between the shaft and the photosensor in the case where a mounting error is present (an example of the related art)
Figure 2B:
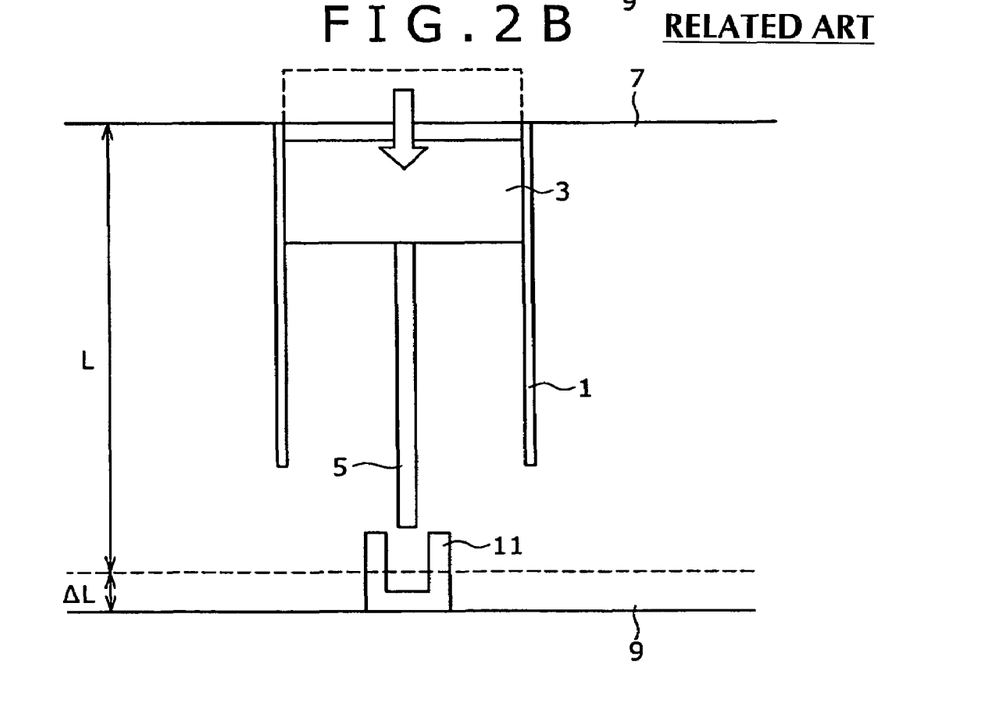

FIG. 2 shows such a situation. FIG. 2A shows the condition where the operating surface 7 and the wiring board 9 are remote from each other further by $\Delta L$, as compared with the designed mounting position (indicated by broken line). In this case, as shown in FIG. 2B, even when the button top 3 is depressed, the tip end of the shaft 5 cannot intercept the light of the detection sensor 11. The value of $\Delta L$ is, for example, 2 mm.

In addition, even in the case where the tip end of the shaft 5 can intercept the light of the detection sensor 11, the position of detection of the ON/OFF state may be shifted.

In such a situation, accurate ON/OFF operations cannot be expected. For example, the switching operations become instable, or the feeling of operation may be worsened.

Therefore, in the case of a switch having a conventional structure, it may be necessary to keep the dimensional accuracy and assembly accuracy of component parts very high. At the same time, also as to the attaching surface and the mounting surface, high mounting accuracies and restrictive conditions may be needed.

Paying attention to the above-mentioned technical problems, the present inventors propose a switch mechanism of a detection sensor unmounted type, wherein an enlarging mechanism for transmitting, in a magnified form, a change in the position of a movable member attendant on a button operation is mounted.

Incidentally, an attaching surface for a case body for containing the movable member moved in conjunction with the button operation is assumed to be different from a mounting surface for the detection sensor for electrically detecting a change in the position of the movable member attendant on the button operation.

With the magnifying mechanism adopted, the reliability of the switching operations is enhanced. Besides, the mounting accuracy and restrictive conditions required on the side of a housing to which the switch mechanism is attached can be moderated.

DETAILED DESCRIPTION OF THE PREFERRED EMBODIMENTS

Now, an embodiment of a switch mechanism of a detection sensor unmounted type and a control panel according to the technique pertaining to the present invention will be described below.

It is to be noted that known technologies in the art pertaining to the invention are applied to the portions not specifically shown in the drawings or described in this specification.

Besides, the embodiment described below is merely an embodiment of the present invention, and the invention is not limited to or by the embodiment.

(A) Control Panel

Figure 3:
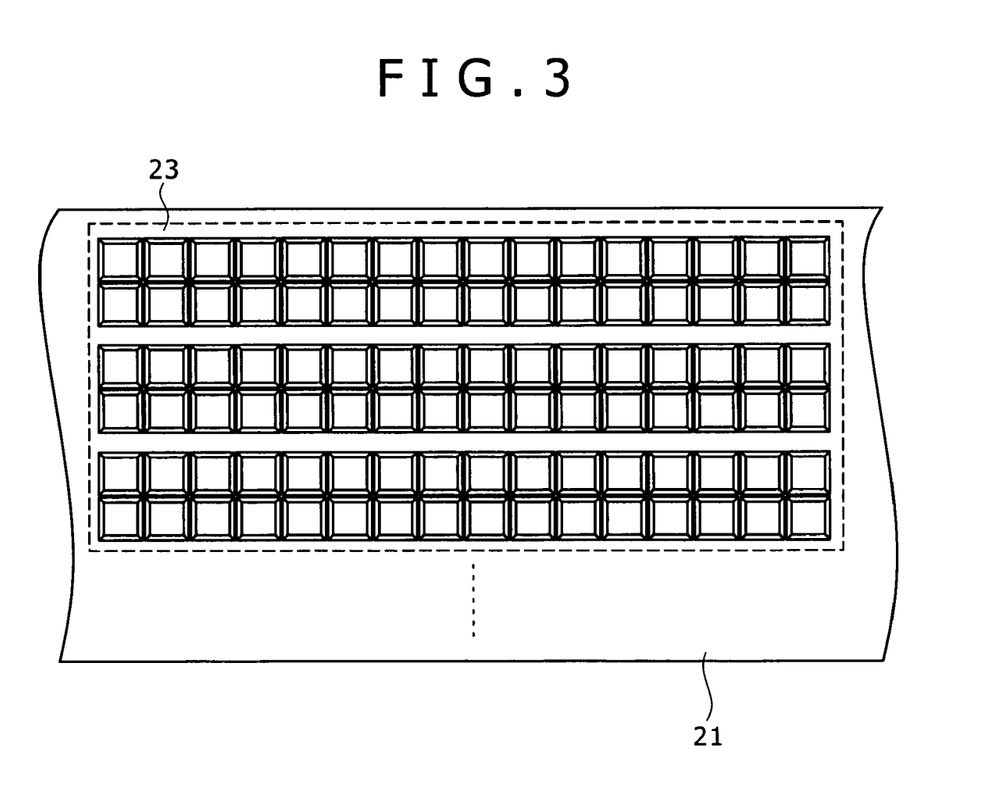
FIG. 3 is a diagram illustrating an example of use form of a live switcher.

FIG. 3 illustrates an example of a control panel for a live switcher. FIG. 3 corresponds to an operating surface of the control panel 21. Operating buttons 23 are arranged in a number of stages on the control panel 21. By operating the operating buttons 23, it is possible to perform switching of signals to be connected, turning ON/OFF of various functions, switching of mode, and the like operations.

Figure 4:
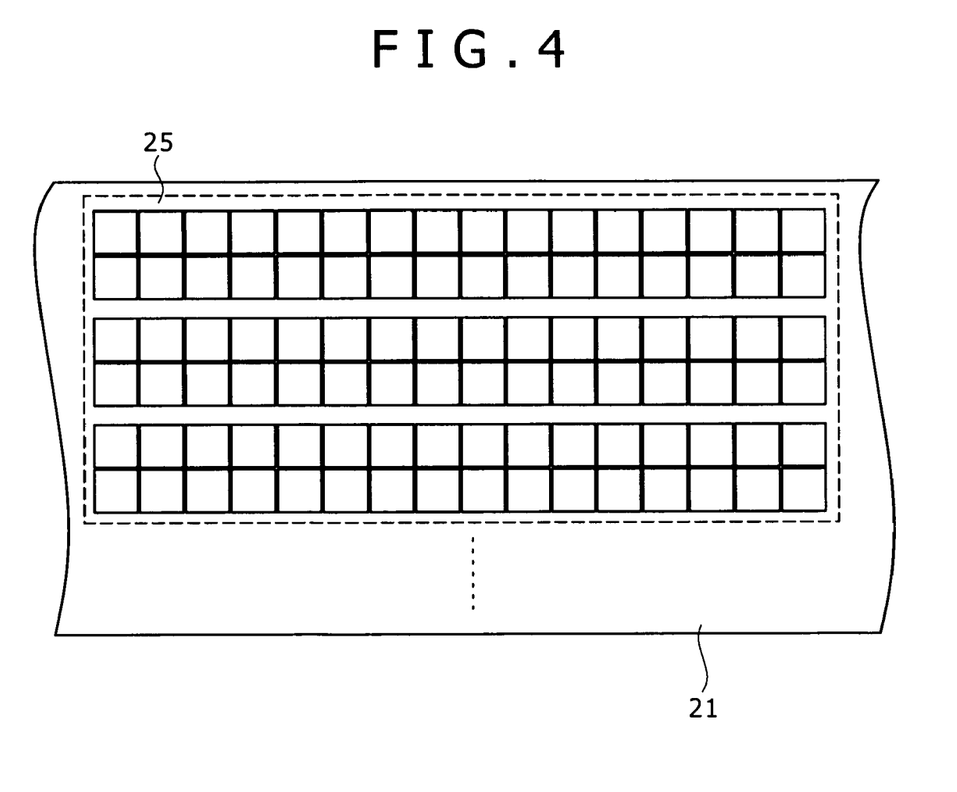
FIG. 4 is a diagram illustrating a configuration example of a control panel surface for the live switcher.

FIG. 4 illustrates the face structure of the control panel 21 in the condition where the operating buttons 23 have been removed. The operating buttons 23 are inserted into openings 25 formed in the panel face of the control panel 21, from the face side, and are locked mechanically.

(B) Operating Button

Figure 5:
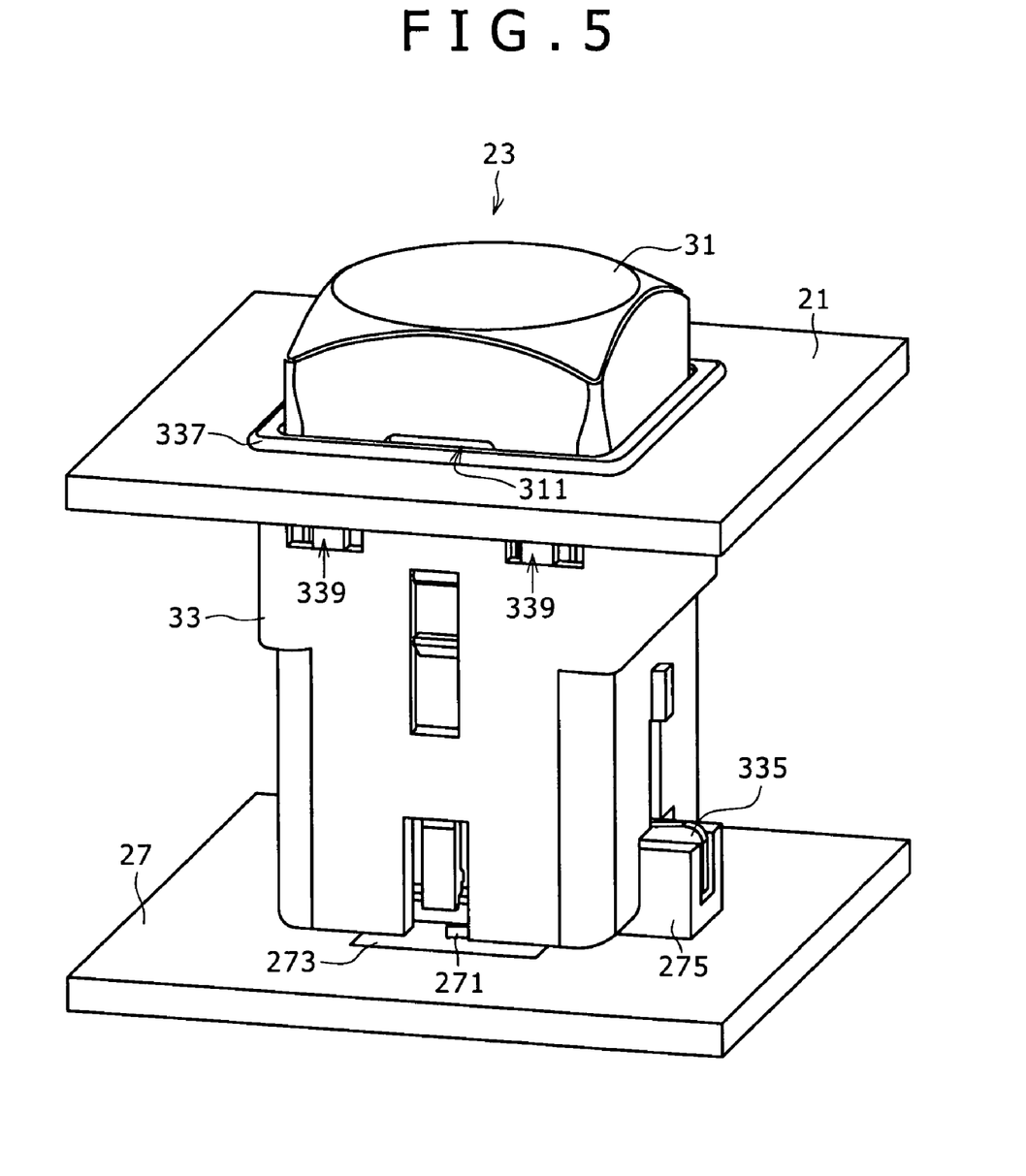
FIG. 5 is a diagram illustrating a mounted condition of an operating button.

FIG. 5 is a diagram showing, in enlarged form, a mounting portion of one operating button 23. Incidentally, the operating button 23 is composed of a plurality of plastic parts.

The operating button 23 is composed of a key top 31 and a main body case 33.

The key top 31 is detachably attached to an end portion, on the face side, of the main body case 33. In this embodiment, lock pawls 311 for attachment are arranged so as to respectively face two side surfaces of the key top 31.

The key top 31 has an appearance which is roughly square as viewed from the face side of the control panel 21. Incidentally, the operating surface of the key top 31 is provided with a concavity for easy operation thereof.

The key top (button's operating surface) 31 is formed of a light-transmitting material so that the operation status of the operating button 23 can be visually confirmed by the turning-ON/OFF of light or changes in light emission color which are confirmed through the key top 31. Namely, the operating button 23 is a lighting button. Here, the key top 31 is mounted in a hole in an inside upper portion of the main body case 33 by hook pawls.

In this embodiment, the operating button 23 is composed only of a drive mechanism, and electronic parts (surface-mounted parts, a wiring pattern, a resistor, etc.) are all mounted on a printed wiring board 27. In other words, the operating button 23 is completely separated from the electric circuit, and the light confirmed through the key top 31 is guided from a light emitting device mounted on the printed wiring board 27.

As the light emitting device, for example, two kinds of LEDs (Light Emitting Diodes) different in light emission color are used. Incidentally, the number and the layout positions of the LEDs 271 allotted to one operating button 23 may be arbitrarily selected. In this embodiment, six LEDs 271 are arranged for one operating button 23. The six LEDs 271 consist of four green LEDs 271A and two red LEDs 271B.

A technique is adopted in which the light emitted from each LED 271 is guided to the key top 31 through the light guide tube 331 arranged in the inside of the main body case 33.

Figure 6:
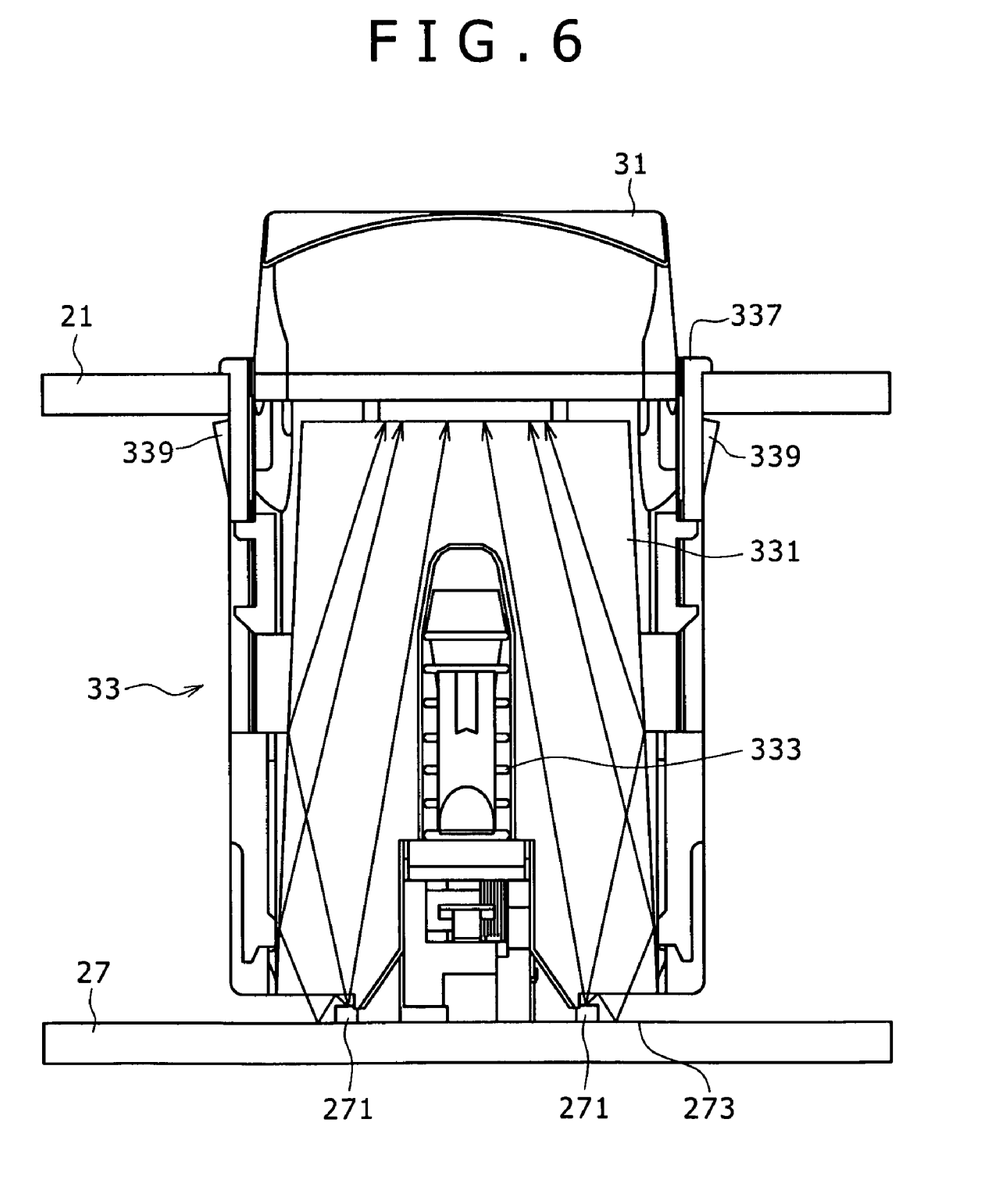
FIG. 6 is a diagram showing optical paths inside a light guide tube along which light reflected on a silk screen printed surface passes.

FIG. 6 shows a layout example of the light guide tube 331. The light guide tube 331 is formed of a transparent resin, for example, an acrylic resin. In view of a structural restriction imposed on the operating button 23, an inverted U-shaped structure is adopted for the light guide tube 331. The restriction here is the need to dispose a compression coil spring 333 under a central portion of the operating surface.

The light of the LED 271 is emitted roughly hemispherically toward the upper side of the board, due to the light orientation characteristic of the LED 271. In view of this, the shape of the light guide tube 331 on the light intake side is specially designed so that reflection of the light on the surface of the light guide tube 331 is prevented as much as possible.

Incidentally, a lighting button (an operating button of which the operating surface can be luminous) may be disposed very close to the adjacent lighting button. In view of this, a contrivance is also adopted such as to obviate the situation in which the light radiated from the LED might be transmitted through the light guide tube of the adjacent switch to illuminate the adjacent key top. Specifically, a structure is adopted in which the light guide tube 331 is covered with the main body case 33, to a position very close to the printed wiring board 27.

In addition, the inside surface of the light guide tube 331 is contrived to enhance reflection efficiency so as to prevent light from escaping. For example, the inside surface of the light guide tube 331, exclusive of an upper end surface, is mirror finished. Therefore, the light entering the inside of the light guide tube 331 undergoes total reflection, to be thereby guided to the upper end surface. Incidentally, with the light reflected (disturbed) in the interior of the light guide tube 331, the light guided to the upper end surface becomes uniform, whereby irregularities in luminance or in color are reduced.

Incidentally, the light guided to the upper end surface of the light guide tube 331 is radiated at all angles from the ceiling surface by crimps or a diffusing material formed on the ceiling.

The light radiated from the light guide tube 331 is incident on the inside surface of the key top 31. In this embodiment, for further enhancing the light diffusing effect, a diffuser plate is disposed just on the inside of the key top 31. The diffuser plate is formed of a material loaded with a diffusing agent. For example, the diffuser plate is formed of a material loaded with PET (PolyEthylene Terephthalate).

Further, in this embodiment, a contrivance for increasing the amount of light guided to the key top 31 is adopted. Specifically, a white-colored silk screen printed surface 273 is formed in the surroundings of the LEDs 271 (on the surface, opposed to the light guide tube 331, of the printed wiring board 27).

With the silk screen printed surface 273 thus provided, the reflectance of the board surface is enhanced. This ensures that the light radiated toward the printed wiring board 27 and the light reflected by the lower surface of the light guide tube 331 to return to the board surface can be wastelessly guided in the direction of the light guide tube 331.

Incidentally, the silk screen printed surface 273 can be formed by utilizing the silk screen process for producing the printed wiring board 27. Therefore, little additional cost is needed.

With the silk screen printed surface 273 thus arranged, the key top 31 of the lighting switch becomes brighter and is thereby enhanced in visibility.

In addition, a detecting device for detecting an operation of depressing the key top 31 is mounted on the printed wiring board 27. In this embodiment, a non-contact type sensor is used as the detecting device. For example, there is arranged a transmission-type photosensor 275 having a light emitting portion and a light receiving portion opposed to each other, with the moveable range of a turnable light-shielding plate 335 as a movable member therebetween.

The photosensor 275 detects the movement of the turnable light-shielding plate 335, thereby the turning ON/OFF of the switch by the depressing of the key top 31. Incidentally, the result of the detection is given to a control circuit for controlling the light emission of the LEDs 271.

In this embodiment, when the key top 31 is not depressed, the turnable light-shielding plate 335 intercepts the light emitted from the light emitting portion, resulting in that the light receiving portion does not detect the light.

On the other hand, when the key top 31 is depressed, the condition where the light from the light emitting portion is detected by the light receiving portion results. The detecting device is not limited to the transmission-type photosensor; for example, a reflection-type photosensor, an electromagnetic induction type or electrostatic type non-contact sensor, a contact-type sensor using metal or rubber as contacts, or the like can also be used.

Figure 7:
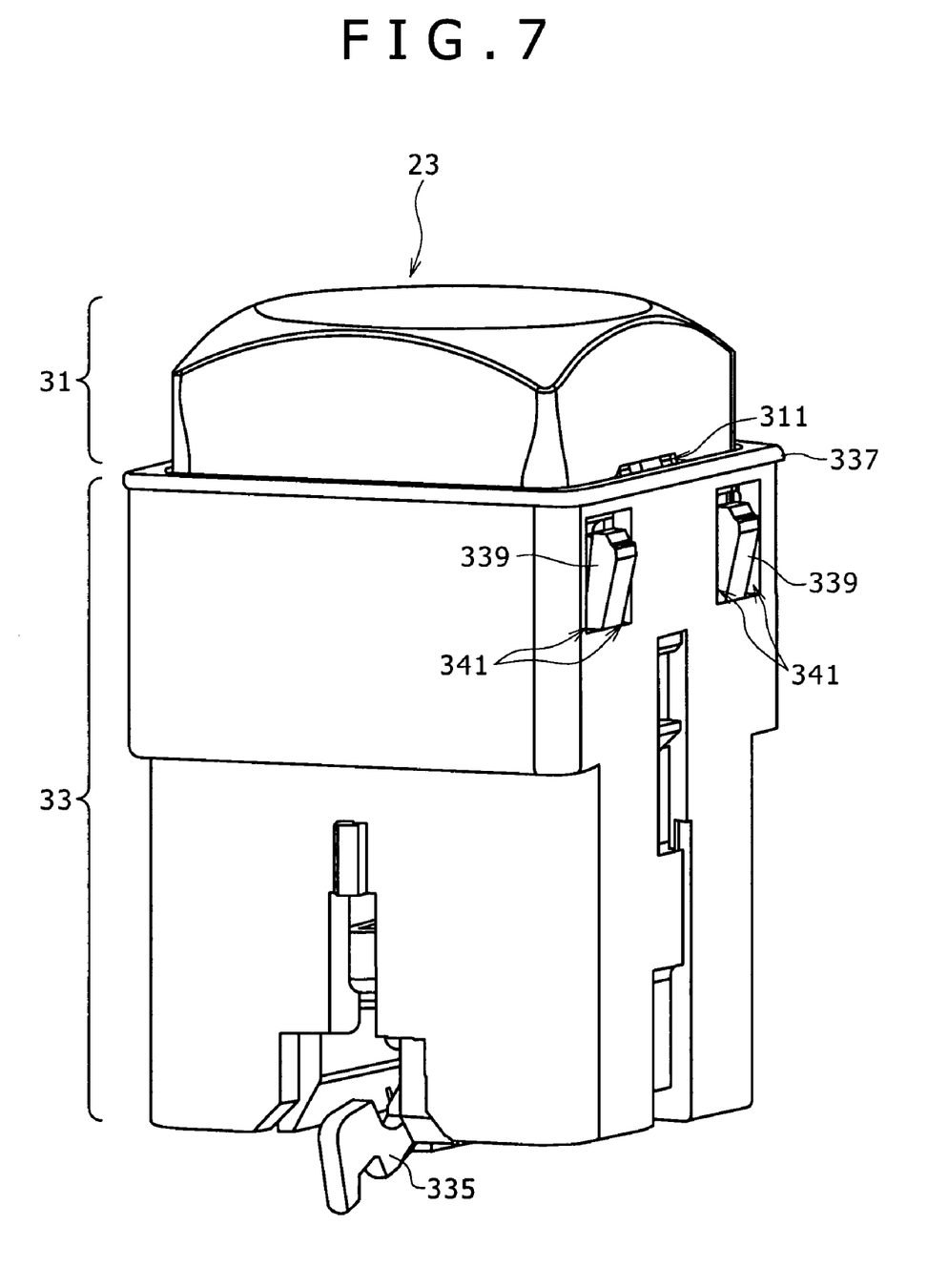
FIG. 7 is a diagram showing an appearance of an operating button.

FIG. 7 shows an example of an appearance of the operating button 23. As has been described referring to FIG. 5, the operating button 23 is composed of the key top 31 and the main body case 33.

The main body case 33 is formed in a tubular shape rectangular in section. The outside size of the main body case 33 is determined based on the inside size of the opening 25 of the control panel 21. Specifically, the outside size of the main body case 33 is set to be slightly smaller than the inside size of the opening 25. On the other hand, the top outer edge portions 337 of the main body case 33 are formed to be larger than the opening 25. The top outer edge portions 337 of the main body case 33 function as a stopper for preventing the main body case 33 from falling into the inside of the control panel 21.

A total of four lock pawls 339 are formed at side surfaces of the main body case 33. Of the four lock pawls 339, two are formed on each of two opposite ones of the four side surfaces constituting the main body case 33.

Each of the lock pawls 339 is fixed to the side surface at one end thereof, whereas the other end thereof is completely separated from the main body case 33 by gaps 341 so formed as to surround the outer periphery of the lock pawl 339.

In addition, the lock pawl 339 is so mounted that its projection amount relative to the side surface of the main body case 33 increases along the direction from its fixed end toward its free end. In other words, the lock pawl 339 is mounted in a skew direction relative to the insertion direction of the main body case 33.

Due to this structure, at the time of inserting the main body case 33 into the opening 25, the outside inclined surfaces of the lock pawls 339 abut on the inner wall surfaces of the opening 25, and are deflected to the inside of the main body case 33 by the attendant stress.

It is to be noted here that when the main body case 33 is inserted until it reaches a prescribed position, the outside inclined surfaces of the lock pawls 339 are released from the abutment on the inner wall surfaces of the opening 25. In this instance, each lock pawl 339 restores its positional relationship with the main body case 33 before the insertion, under its own elastic restoring force. In other words, each lock pawl 339 is opened to the outer side relative to the side surface of the main body case 33 under its own restoring force.

In this instance, the condition where the control panel 21 is clamped from both sides thereof by the top outer edge portions 337 and the lock pawls 339 is obtained. This results in that the main body case 33 is locked to the control panel 21. In other words, the top outer edge portions 337 function to prevent the main body case 33 from falling into the inside of the control panel 21, and the lock pawls 339 function to prevent the main body case 33 from being disengaged to the face side of the control panel 21.

Accordingly, for releasing the locked condition, it suffices to deform the lock pawls 339 to the inside of the main body case 33 and thereby to release the lock pawls 339 from the abutment on the back surface of the control panel 21.

In addition, a component part operated according to button operations is incorporated in the main body case 33. In this embodiment, a movable mechanism for converting the button operations into rotating motions of the turnable light-shielding plate 335 is mounted in the main body case 33.

Figure 8:
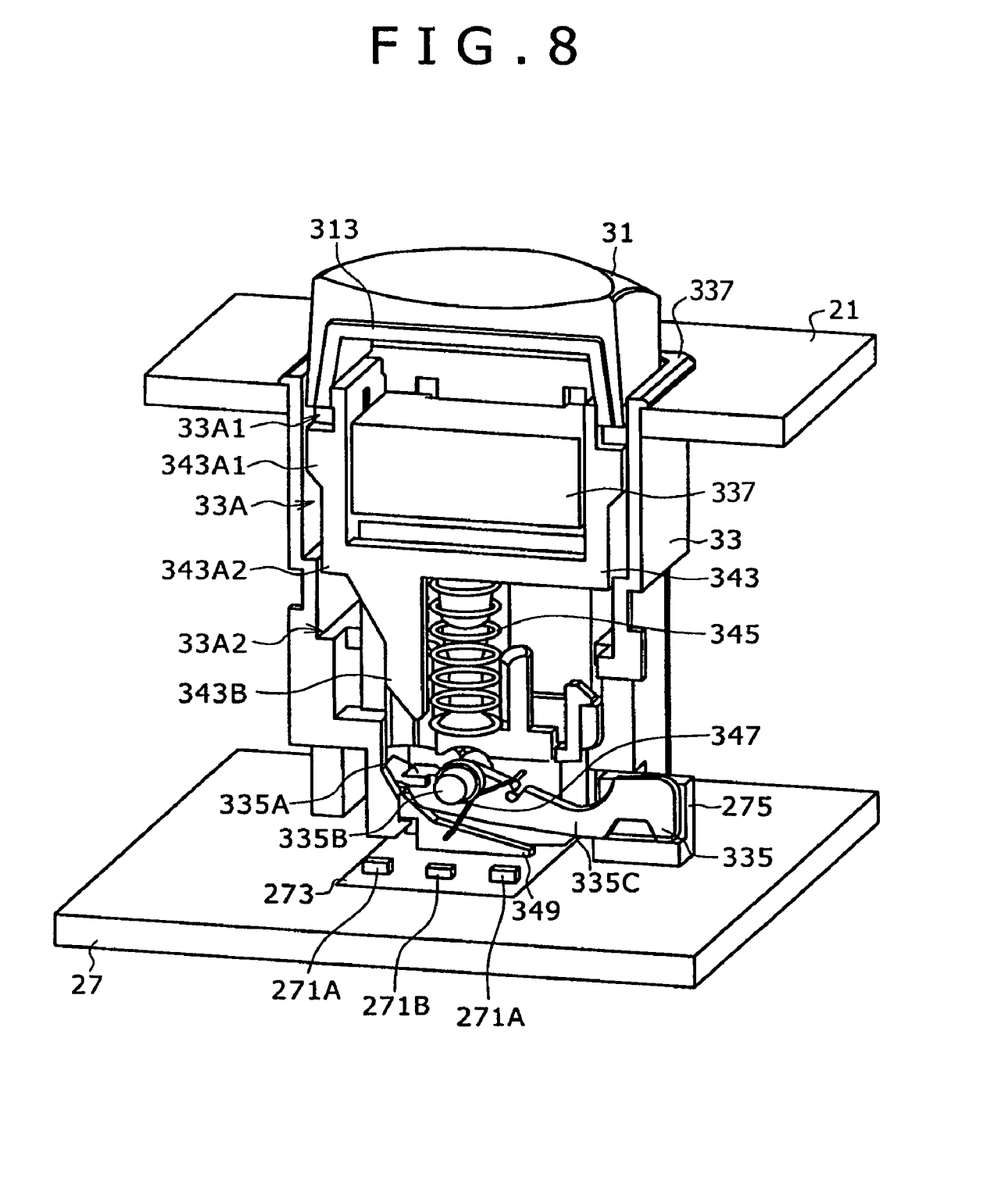
FIG. 8 is a diagram illustrating the inside structure of the operating button (at normal time)
Figure 9:
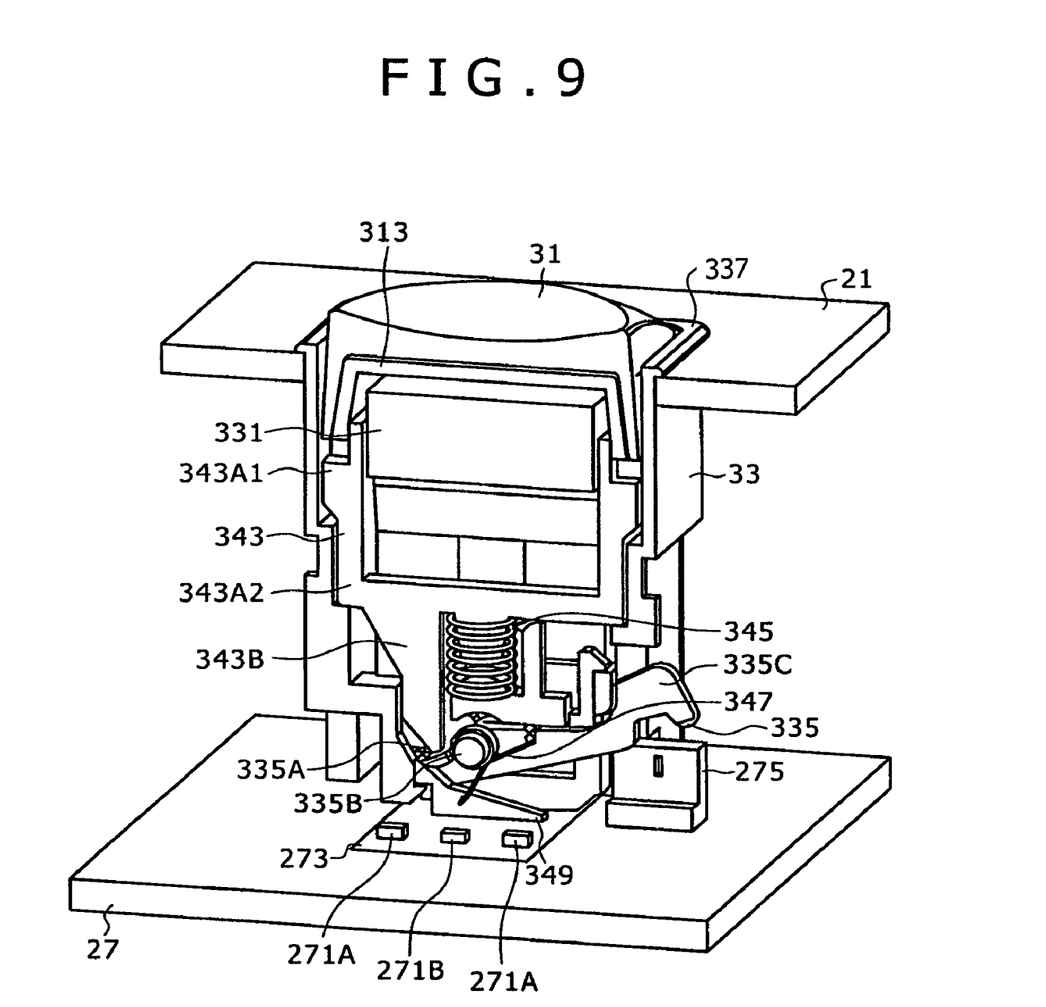
FIG. 9 is a diagram illustrating the inside structure of the operating button (when depressed)

Referring to FIGS. 8 and 9, the movable mechanism will be described in brief. Incidentally, FIG. 8 shows the engagement relationship of the movable mechanism in the condition where the key top 31 is not depressed. On the other hand, FIG. 9 shows the engagement relationship of the movable mechanism in the case where the key top 31 is depressed. A diffuser plate 313 arranged on the inside of the key top 31 is also shown in FIGS. 8 and 9.

The movable mechanism is composed of a slider 343, a compression coil spring 345, a torsion coil spring 347, and the turnable light-shielding plate 335. Incidentally, the turning mechanism is contained in a holder 349 which is fitted in a bottom portion of the main body case 33.

The slider 343 is a component part which is moved up and down correspondingly to the operations of the key top 31. The slider 343, for not slipping off from the main body case 33, is guided along guide grooves 33A in the main body case 33 by guide projections 343A1 and 343A2 formed on side surfaces thereof.

The guide projections 343A1 are stoppers for stopping an upward sliding motion by abutting on the upper ends 33A1 of the guide grooves 33A. On the other hand, the guide projections 343A2 are stoppers for stopping a downward sliding motion by abutting on the lower ends 33A2 of the guide grooves 33A.

A portion of the slider 343 constitute a shaft 343B. The shaft 343B is a component part by which a depressing force exerted on the key top 31 is transmitted to one end portion 335A of the turnable light-shielding plate 335. Here, the turnable light-shielding plate 335 is turned about a turning shaft 335B fitted in a shaft hole formed in the holder 349.

The turnable light-shielding plate 335 corresponds to the see-saw structure as set forth in the claim. Therefore, when the end portion 335A is depressed by the shaft 343B, the other end 335C of the turnable light-shielding plate 335 is lifted up, reversely. On the contrary, when the other end 335C of the turnable light-shielding plate 335 is lowered, the end portion 335A is lifted up, reversely.

At the times of the turning motions, the other end portion 335C of the turnable light-shielding plate 335 is moved across the optical axis of the photosensor 275.

Here, the arms of the turnable light-shielding plate 335 are formed to be asymmetric with respect to the turning shaft 335B. In this embodiment, the length of the arm from the turning shaft 335B to the end portion 335C is set to be larger than the length of the arm from the turning shaft 335B to the end portion 335A.

With the arm lengths set to be asymmetric, the shifting amount of the longer arm is magnified, as compared with the shifting amount of the shorter arm. Therefore, the moving amount of the end portion 335C is magnified to several times the depression amount.

Incidentally, the moving amount of the end portion 335C is magnified in the vertical direction. Accordingly, even where the parts accuracy and the assembly accuracy are lowered and the vertical distance is enlarged as compared with the originally designed positional relationship, it is possible for the end portion 335C to be moved across the optical axis of the photosensor 275.

Here, the timing at which the end portion 335C crosses the optical axis is the timing of switching. In this embodiment, the end portion 335C is inverted U-shaped downwardly so that the switching timing will be stable irrespectively of variations in the relative distance. The recessed portion in the inverted U shape is provided at a position of crossing the optical axis. The presence of the recessed portion (or the inverted U shape) ensures that the condition of not intercepting the optical axis can be generated even at a stage where the moving amount of the end portion 335C is small.

Incidentally, the depressed slider 343 is returned into the state before the depression, by a repelling force generated by the compression coil spring 345 which is fitted between a dowel formed on the lower surface of the slider 343 and a dowel formed on the holder 349.

In addition, the end portion 335C of the turnable light-shielding plate 335 lifted up attendant on the depressing operation is turned in the reverse direction by a restoring force of the torsion coil spring 347. To be more specific, the end portion 335C of the turnable light-shielding plate 335 is turned so as to be lowered to the position for intercepting the optical path of the photosensor 275.

(C) Assembly of Operating Button

First, the compression coil spring 345 is attached to the dowel of the slider 343. In this condition, the slider 343 is inserted from the upper opening side of the main body case 33.

In this instance, the guide projections 343A1 and 343A2 are fitted in the guide grooves 33A in the main body case 33. In addition, the shaft 343B of the slider 343 is inserted in a hole provided in the main body case 33. Thereafter, the light guide tube 331 is inserted from the lower opening side of the main body case 33. Incidentally, the light guide tube 331 is so structured that a projected portion at its tip end is hooked on a pawl at the bottom of the main body case 33 and, therefore, it will not slip off.

Next, the torsion coil spring 347 is attached to the turning shaft 335B of the turnable light-shielding plate 335. In this condition, the turning shaft 335B of the turnable light-shielding plate 335 is fitted into a bearing portion of the holder 349. In this condition, the holder 349 is mounted into position from the lower opening side of the main body case 33.

Upon the above assembling steps, the switch mechanism of the detection sensor unmounted type is completed. In this specification, the whole of the main body case 33 and the drive mechanism incorporated therein is referred to as the "switch mechanism".

Subsequently, the switch mechanism is mounted into the opening 25 from the face side of the control panel 21. The switch mechanism is so structured that it is prevented, by the lock pawls 339 provided at the side surfaces of the main body case 33, from easily slipping out of position.

At this state, the diffuser plate 313 is attached to the key top 31. Specifically, the diffuser plate 313 is lightly press fitted into the inside of inner edge portions of the key top 31. In this instance, lock pawls of the diffuser plate 313 are inserted into and hooked in side grooves of the key top 31, and the key top 31 and the diffuser plate 313 are united.

The groove at the press fit portion between the key top 31 and the diffuser plate 313 functions also as a hook portion at the time of detaching the key top 31 from the slider 343 by use of a tool.

Thereafter, the key top 31 is attached to the slider 343 inside the main body case 33 attached to the control panel 21.

The control panel 21 is mounted on an apparatus main body for housing the printed wiring board 27, whereby the live switcher is completed.

(D) Switch Actions (a) Basic Action

As shown in FIG. 8, in the condition where the key top 31 is not depressed, the tip end portion 335C of the turnable light-shielding plate 335 is at a position for intercepting the optical axis of the photosensor 275.

With the key top 31 depressed under this condition, the slider 343 is moved downwards. When the depression amount reaches or exceeds a predetermined amount, the tip end of the shaft 343B formed at the lower end of the slider 343 begins to depress the one end portion 335A of the turnable light-shielding plate 335.

As a result, the turnable light-shielding plate 335 is turned counterclockwise about the turning shaft 335B, resulting in the condition where the optical axis of the photosensor 275 is opened as shown in FIG. 9.

The opening of the optical axis is detected by a control circuit connected to the photosensor 275. This means that the depression of the key top 31 has been successfully detected in a non-contact manner.

When the depression of the key top 31 is stopped under this condition, the slider 343 (i.e., the key top 31) is returned into its original position by the repelling force of the compression coil spring 345. Attendant on this, the turnable light-shielding plate 335 freed from the depressing force exerted by the shaft 343B is rotated clockwise by the restoring force of the torsion coil spring 347. As a result, the turnable light shielding plate 335 is returned into its original position, so as to again intercept the optical axis of the photosensor 275.

The interception of the optical axis is detected by the control circuit connected to the photosensor 275.

The switch mechanism includes no portion that receives external forces, inclusive of friction, other than the repelling force of the compression coil spring 345, and the detection sensor of the non-contact type is used in the switch mechanism; therefore, a good feeling of operation can be obtained with the switch mechanism.

In addition, the repelling force of the torsion coil spring 347 is a very light restoring force which is required only to rotate only the turnable light-shielding plate 335 into its original position when the slider 343 is not being pushed down.

Therefore, there is no possibility that the repelling force might rapidly increase from an intermediate point in the stroke of the key top 31 to thereby worsen the feeling of depression.

(b) Actions in the Case of a Large Error in Relative Position

Figure 10:
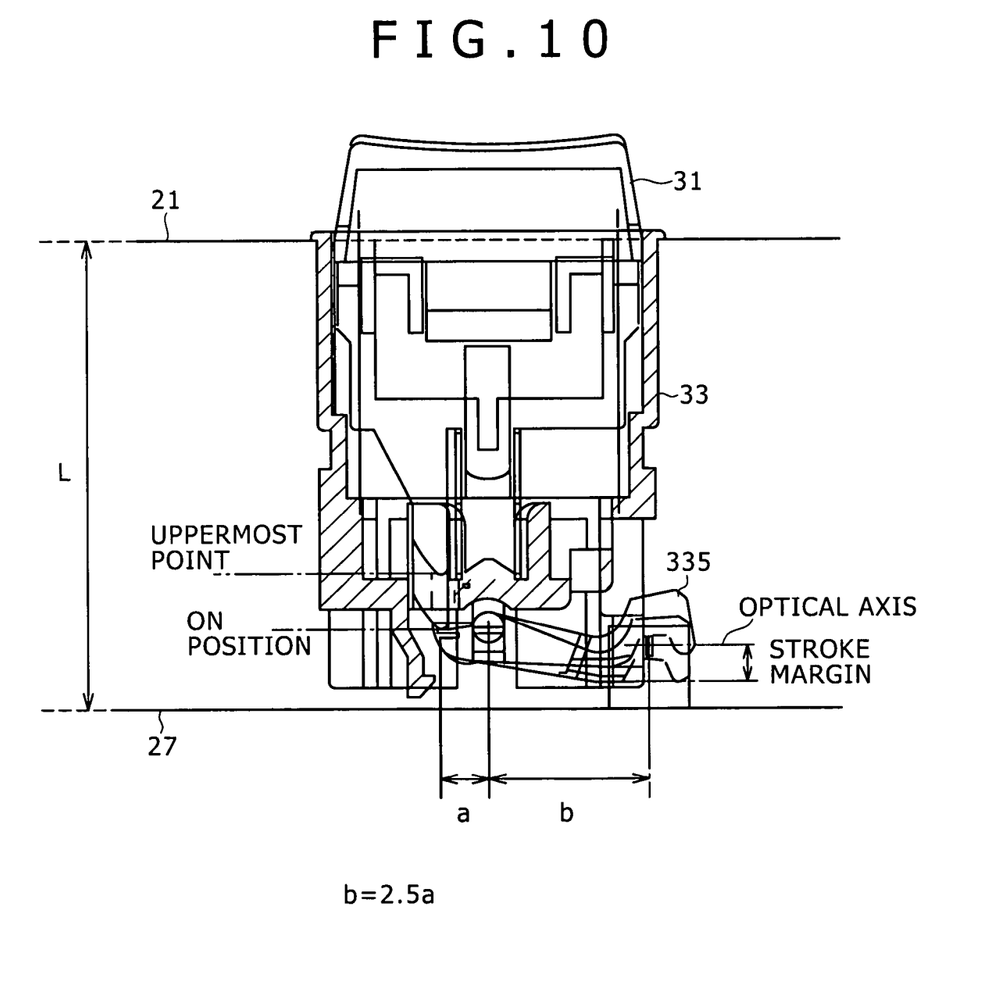
FIG. 10 is a diagram illustrating the relationship between a shaft and a photosensor in the case where no mounting error is present (an embodiment of the present invention)
Figure 11:
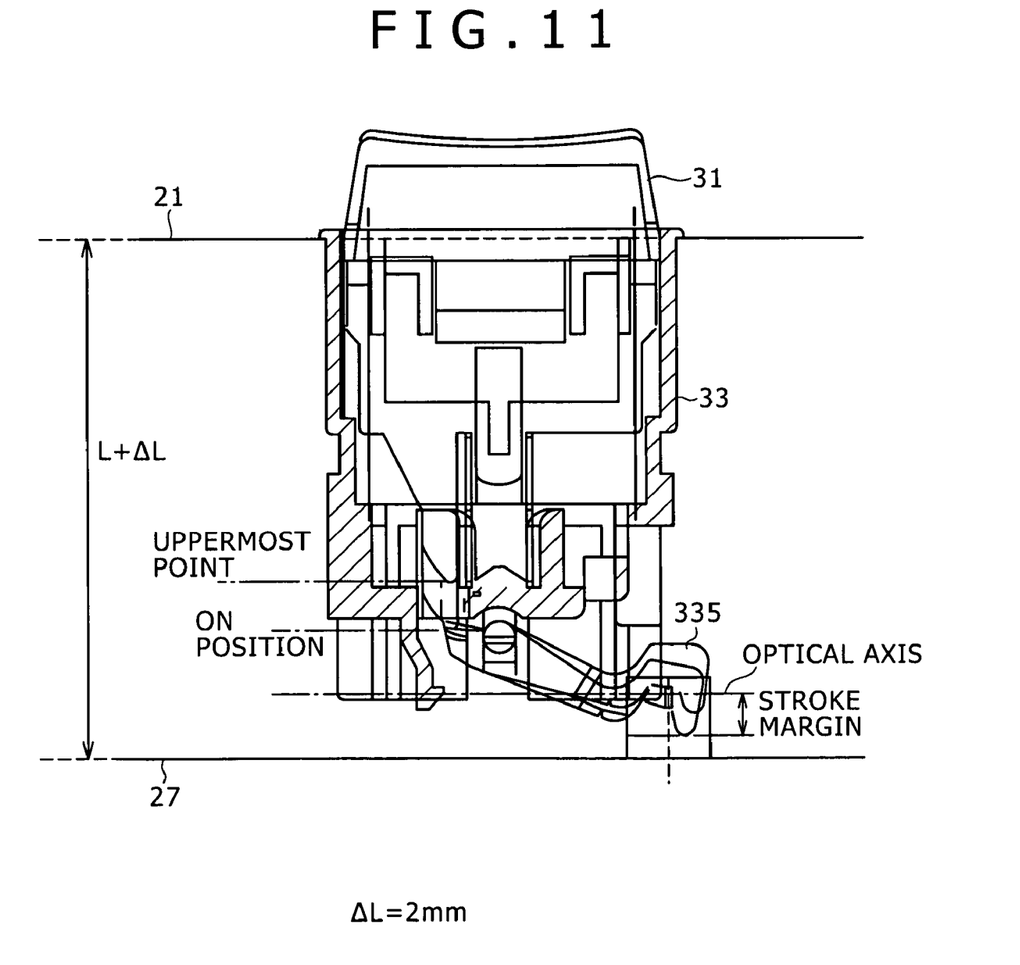
FIG. 11 is a diagram illustrating the relationship between the shaft and the photosensor in the case where a mounting error is present (an embodiment of the present invention).

Referring to FIGS. 10 and 11, description will be made of the difference generated in the switching operation in the case where a mounting error is generated between the control panel 21 and the printed wiring board 27.

Incidentally, FIG. 10 corresponds to the case where the positional relationship between the control panel 21 and the printed wiring board 27 accords to a designed center value. On the other hand, FIG. 11 corresponds to the case where the positional relationship between the control panel 21 and the printed wiring board 27 is widened by 2 mm, as compared with the designed center value.

Here, a is the distance between the shaft-side end portion 335A of the turnable light-shielding plate 335 and the turning shaft 335B, and b is the distance between the photosensor-side end portion 335C of the turnable light-shielding plate 335 and the turning shaft 335B.

Besides, in FIGS. 10 and 11, it is assumed that the relation of b=2.5a is satisfied. Namely, it is assumed that the distance b is 2.5 times the distance a.

With the arm length on the photosensor side set to be 2.5 times that on the shaft side, the stroke on the photosensor side can be made to be 2.5 times the stroke on the shaft side. Therefore, it is possible to substantially exclude the influence of a mounting error, if any, in the vertical direction between the operating button 23 and the photosensor 275.

In other words, the switch can be turned ON/OFF at the time when the operating button 23 is stroked by a specified amount, irrespectively of the presence or absence of the mounting error in the vertical direction. This is effective for stabilizing the feeling of switch operation. In both cases of FIG. 10 and FIG. 11, the stroke margin is substantially the same.

In addition, with the rotation range of the turnable light-shielding plate 335 widened, it is always possible to produce the optical axis intercepting condition through abutment of the turnable light-shielding plate 335 on a bottom portion of the photosensor 275, as shown in FIG. 11, even in the case where the positional error in the direction of parting away in the vertical direction is enlarged. Accordingly, it is possible to maintain assured switch actions.

Incidentally, in the case where a mounting error in the approaching direction is generated between the control panel 21 and the printed wiring board 27, the end portion 335C of the turnable light-shielding plate 335 interferes with and collides on the bottom portion of the photosensor 275. In this case, a relief mechanism such as a torsion coil spring is provided, for obviating the breakage of a component part or the exertion of an irrational force.

(E) Effects

In the case of a switch mechanism composed of a plurality of component parts, it is necessary to take into account the dispersions in dimensional accuracy of the individual parts, assembly errors and the like. It is difficult to always secure the dimensional accuracy among the component parts, and enhancing the accuracy is inevitably accompanied by rises in the parts cost and the assembly cost.

However, where a stroke magnifying mechanism (the turnable light-shielding plate 335 such that the arm length on the photosensor side is set to be several times the arm length on the shaft side) is mounted on a switch mechanism, secure switching actions can be ensured even where a lowering in accuracy or an assembly error is present.

Even though the mounting of the magnifying mechanism is accompanied by a slight increase in the cost of the switch mechanism, an enhanced reliability according to the raised cost can be secured.

In addition, it is possible to provide margins as to the reliability of the switch mechanism component parts themselves. Therefore, it is possible to reduce the assembly accuracy and restrictive conditions demanded on the side of the housing of the live switcher. This facilitates the designing on the housing side.

From the foregoing, it is understood that reliability of operations can be secured not only for the individual switch mechanisms but also for the apparatus as a whole.

Besides, in this embodiment, the white color silk screen printed surface 273 is formed in the surroundings of each LED. Therefore, the luminance of the key top 31 can be enhanced without increasing the number of the LEDs or passing an increased current so as to increase the power consumption. Accordingly, the useful life of the LEDs can be prolonged.

The enhanced luminance of the key top 31 naturally leads to an enhanced visibility to the operator.

In addition, the formation of the silk screen printed surface 273 does not need any special component part or technology; namely, the silk screen printing conventionally used on the wiring board can be utilized as it is. Therefore, an additional cost would not be generated.

(F) Other Embodiments (a) While two kinds of LEDs, i.e. green and red LEDs, have been arranged in the above embodiment, one kind of LEDs emitting light in an arbitrary color may be arranged. Besides, one kind of LEDs capable of emitting light in a plurality of colors may be arranged. Incidentally, in the case where one kind of LEDs capable of emitting light in a plurality of colors are used, color irregularities according to the light emission colors can be suppressed easily.

(b) In the above embodiment, the case where the main body case 33 has a tubular shape rectangular in cross section has been described. However, the main body case may be circular or polygonal in cross section, inasmuch as the basic shape of the main body case is a tubular shape.

(c) In the above embodiment, the arm length on the photosensor side has been set to be 2.5 times that on the shaft side. However, this is merely an example, and the value of the magnification factor may be appropriately selected according to the sizes which can be adopted in mounting the turnable light-shielding plate 335.

(d) In the above embodiment, the case where the light guide tube 331 for guiding the light generated at the printed wiring board 27 to the key top 31 is mounted in the inside of the operating button 23 has been described.

However, a configuration in which the light is not guided to the key top 31 may also be adopted.

(e) In the above embodiment, the case where the see-saw structure is used as the mechanism for magnifying the stroke relative to the key top 31 has been described.

However, the magnifying mechanism can be realized by other mechanisms such as a link mechanism, a crank mechanism, and a mechanism using gears or a belt.

(f) In the above embodiment, the turnable light-shielding plate 335 having the see-saw structure has been described.

However, where an electrostatic induction type detection sensor or an electromagnetic induction type detection sensor is utilized for the detection of the switching actions, it suffices that a detection element according to the detection sensor is arranged at the end portion 335C of the turnable light-shielding plate 335.

In addition, where a contact-type detection sensor is utilized for the detection of the switching actions, it suffices that a contact element is arranged at the end portion 335C of the turnable light-shielding plate 335.

(g) In the above embodiment, the structure of the operating button in a business-use switcher has been described as an example of the switch mechanism.

However, the switch mechanism in the present invention is applicable to other switch mechanisms than the switcher and to a general-purpose switch mechanism, inasmuch as the switch mechanism is of the type in which an electric circuit such as a detection sensor and a drive mechanism are separate from each other.

For example, the switch mechanism in the present invention is applicable not only to an editing apparatus and a special effect apparatus but also to home-use electronic apparatuses and electric products.

(h) Various modifications of the above-described embodiment are possible within the scope of the gist of the present invention. Besides, various modified examples and applied examples created on the basis of the description in the present specification are also possible.

What is claimed is:

1. A switch mechanism having a detection sensor not mounted on the switch mechanism, the switch mechanism comprising:
   a magnifying mechanism operative to magnifyingly transmit a change in position of a movable member attendant upon a button operation,
   an attaching surface for a case body containing said movable member which moves in conjunction with the button operation, and
   a mounting surface for the detection sensor for electrically detecting change in the position of said movable member attendant upon the button operation, wherein the attaching surface and the mounting surface are different from each other, and wherein said magnifying mechanism has a structure for converting a rectilinear motion in conjunction with the button operation into a rotating motion of the movable member.

2. The switch mechanism as set forth in claim 1, wherein a distance between a site of intercepting an optical path of said detection sensor and a center of rotation of the rotating motion is set longer than a distance between a point at which a downward load attendant upon a pushbutton operation is exerted and said center of rotation.

3. The switch mechanism as set forth in claim 1, wherein a distance between a site of connection with said detection sensor through electrostatic induction or electromagnetic induction and a center of rotation of the rotating motion is set longer than a distance between a point at which a downward load attendant upon a pushbutton operation is exerted and said center of rotation.

4. The switch mechanism as set forth in claim 1, wherein a distance between a site of transmitting a load or motion to said detection sensor and a center of rotation of the rotating motion is set longer than a distance between a point at which a downward load attendant upon a pushbutton operation is exerted and said center of rotation.

5. The switch mechanism as set forth in claim 1, wherein said switch mechanism is a component part of a lighting-type switch, and incorporates a light guide element for guiding light of a light emitting device to a button surface.

6. An electronic apparatus comprising:
   an operating surface in which openings for pushbutton-type switches are arranged;
   a wiring board on which detection sensors are arranged, each said detection sensor operative to electrically detect a change in a position of a movable member moved in conjunction with a button operation;
   switch mechanisms of the detection sensor attached to said openings arranged in said operating surface, the detection sensor is not mounted on the switch mechanism, each said switch mechanism having a case body for containing said movable member moved in conjunction with the button operation, and a magnifying mechanism for magnifyingly transmitting the change in the position of said movable member, said magnifying mechanism has a structure for converting a rectilinear motion in conjunction with the button operation into a rotating motion of the movable member; and
   button top parts each detachably attached to each said switch mechanism.

7. The electronic apparatus as set forth in claim 6, wherein said electronic apparatus is for use in a broadcasting system.

8. The electronic apparatus as set forth in claim 6, wherein said pushbutton-type switch is a lighting-type switch; and light emitting devices are mounted on said wiring board, and the board surface is provided, in the surroundings of said light emitting devices, with white-colored silk screen printed portions to form reflective surfaces.

* * * * *